(12) United States Patent
Pandey

(10) Patent No.: US 7,266,742 B1
(45) Date of Patent: Sep. 4, 2007

(54) METHOD AND APPARATUS FOR GENERATING A LOCAL SCAN ENABLE SIGNAL TO TEST CIRCUITRY IN A DIE

(75) Inventor: Kamleshkumar Sureshchandra Pandey, Bangalore (IN)

(73) Assignee: Cisco Technology, Inc., San Jose, CA (US)

( * ) Notice: Subject to any disclaimer, the term of this patent is extended or adjusted under 35 U.S.C. 154(b) by 294 days.

(21) Appl. No.: 10/819,520

(22) Filed: Apr. 6, 2004

(51) Int. Cl.
*G01R 31/28* (2006.01)

(52) U.S. Cl. .................. 714/726; 714/729; 714/731
(58) Field of Classification Search ......... 714/726–731
See application file for complete search history.

(56) References Cited

U.S. PATENT DOCUMENTS

| | | | |
|---|---|---|---|
| 5,898,702 A * | 4/1999 | Narayanan et al. ......... 714/726 |
| 6,442,722 B1 * | 8/2002 | Nadeau-Dostie et al. ... 714/731 |
| 6,990,076 B1 * | 1/2006 | McNamara et al. ........ 370/241 |
| 2002/0162064 A1 * | 10/2002 | Shimizu ..................... 714/726 |
| 2003/0115524 A1 * | 6/2003 | Johnston et al. ............ 714/726 |
| 2004/0153926 A1 * | 8/2004 | Abdel-Hafez et al. ....... 714/726 |
| 2004/0268181 A1 * | 12/2004 | Wang et al. .................. 714/30 |

* cited by examiner

*Primary Examiner*—Guy Lamarre
*Assistant Examiner*—Saqib Siddiqui
(74) *Attorney, Agent, or Firm*—Sierra Patent Group, Ltd.

(57) ABSTRACT

An apparatus for providing a local scan enable signal. The local scan enable signal being used to perform an at-speed test on a portion of circuitry associated with the local scan enable signal. The local scan enable signal is generated from a global scan enable signal and clock signal. The global scan enable signal and clock signal are received from the system and used to generate a local scan enable signal to test each portion of circuitry in the die at speed.

2 Claims, 5 Drawing Sheets

METHOD AND APPARATUS FOR GENERATING A LOCAL SCAN ENABLE SIGNAL TO TEST CIRCUITRY IN A DIE

FIELD OF THE INVENTION

This invention relates to testing of circuitry on a die or package. More particularly, this invention relates to testing of circuitry in a die that operates at different clock speeds. Still more particularly, this invention relates to a system that generates a local scan enable signal to allow circuitry operating at different clock speeds to be tested at-speed.

PROBLEM

One of the important steps in the manufacturing of circuits is the testing of the circuits. Circuits are typically manufactured as dies of many circuits on a board. Each die is then tested. As circuitry gets smaller, the tolerances of the circuitry to defects in a die are very small. This is especially true as the minimum feature size of the process is equal to or less than 0.13 microns. Any manufacturing process causes high impedance shorts and variations of the gate oxide thickness and quality. Most of these defects impair timing performance of the circuitry.

Most circuits are tested under a stuck-at fault model of defects. The stuck-at fault model assumes that a line is permanently stuck at one or zero. Thus, the behavior of the circuitry generating the output on the line is independent of time. Thus, tests are performed at a significantly low speed. However, a circuitry may pass a test performed at relatively low speed and fail once the circuitry is performing at-speed. Thus, it is desirable to perform at-speed tests on the circuitry to determine whether the circuitry will perform under normal conditions.

A first problem with testing circuitry at-speed is that there is typically only one global scan enable signal available to change the mode of scan flip-flops in the circuitry. The global scan enable signal is routed as a clock tree across the die. For at-speed testing, the flip-flops have to change modes at functional speed. Therefore, the timing requirements for the global scan enable signal are strict. This is difficult to meet with one global scan enable signal that must be sent to every portion of the die. Thus, there is need to provide a manner of providing a scan enable signal to the die in a manner that meets the strict timing requirements.

A second problem with testing circuitry at-speed is different portions of circuitry on a die may operate under different clock speeds. A first portion of circuitry may operate by receiving signals from a first clock running at a first speed and a second portion of circuitry may operate by receiving a signal from a second clock running at a second clock speed which is faster than the first clock speed. This is a problem because the prior art use of slow speed testing uses one global scan enable signal to change the mode of scan flip-flops. Thus, if the scan enable signal switches at the first or slower clock speed, the second portion of circuitry is under tested and if the scan enable signal switches at the second or faster clock speed, the first portion of circuitry is over tested. Thus, it is desired to find a solution that would allow both portions of the circuitry to be tested at-speed.

SUMMARY OF THE INVENTION

The above and other problems are solved and an advance in the art is made by the provision of local scan enable signals in accordance with this invention. A first advantage of the provision of a local scan enable signal makes routing of signals easier and allows timing requirements of the scan enable signals to be more easily met. A second advantage of the provision of a local scan enable signal is that the global scan enable signal can be switched in a proper time by using an extra half cycle of a clock from the last shift cycle. A third advantage is that multiple clock frequencies can be tested by generating the local scan enable signal based upon the capture clock of the circuitry to be tested. A fourth advantage of this invention is that only one capture cycle is needed to test when a local scan enable signal is employed.

In accordance with this invention, there is an apparatus for providing a local scan enable signal to circuitry on a portion of a die. The apparatus includes circuitry that receives a global scan enable signal, circuitry that receives a clock signal, circuitry that generates the local scan enable signal responsive to reception of the global scan enable signal and the clock signal, and circuitry that applies the local scan enable signal to the portion of circuitry. The circuitry may further include circuitry that receives a test mode signal that indicates the portion of the die that is to be tested.

The circuitry that generates the local scan enable signal may include a flip-flop that receives the clock signal and the global enable signal and outputs the local scan enable signal. The circuitry that receives the clock signal may include an inverter that receives the clock signal and applies the clock signal to the flip-flop. The circuitry that receives the global scan enable signal may include or-gate circuitry that receives the global enable signal and an inverted output from the flip-flop and applies an output to the flip-flop. The apparatus may also include an inverter connected to an output of the flip-flop and to an input of the or-gate circuitry to provide the inverted output of the flip-flop. The flip-flop may output an intermediate local scan enable and the apparatus may include and-gate circuitry having a first input connected to the output of the flip-flop to receive the intermediate local scan enable signal, a second input for receiving the global enable signal, and an output connected to the input of said flip-flop.

In accordance with this invention, a method for testing a portion of circuitry on a die is performed in the following manner. Clock signals are received from the clock pin for the portion of the circuitry. Global scan enable signals for the die are received. Local scan enable signals are generated from the clock signals and the global scan enable signals responsive to receiving the clock signals. The local scan enable signals are applied to the circuitry to indicate testing of the circuitry. Test data is read from said circuitry.

In one exemplary embodiment of the invention, a first local scan enable of a known value response is generated to initialize a test. The first known value may be high or one and the method may include receiving a global scan enable signal having a first value, receiving a test mode signal having a first value, and generating the first local scan enable signal at the known value responsive to receiving the first values of the global scan enable signal and the test mode signal. The first value of the global scan enable signal may be high. The first value of the test mode signal is high.

The local scan enable having a second known value may be generated in the following manner. A global scan enable signal having a second value is received. A first group of cycles of the clock signals is received and a second local scan enable signal having a second known value is generated responsive to the reception of the second value of the global scan enable signal. The second value of the global scan enable signal is low. The second known value of the second local scan enable signal is low. After a subsequent cycle of the clock signal is received, a third local scan signal having the first known value is generated and applied to the circuitry.

BRIEF DESCRIPTION OF THE DRAWINGS

The above and other features of this invention are described in the following Detailed Description and shown in the following drawings.

DETAILED DESCRIPTION

This invention provides a method for providing at-speed testing of circuitry on a die by providing a local scan enable signal to portions of the circuitry. This invention includes the circuitry for generating the local scan enable the signal and a method for using the circuitry to perform an at-speed test of the portion of the circuitry.

Figure 1:
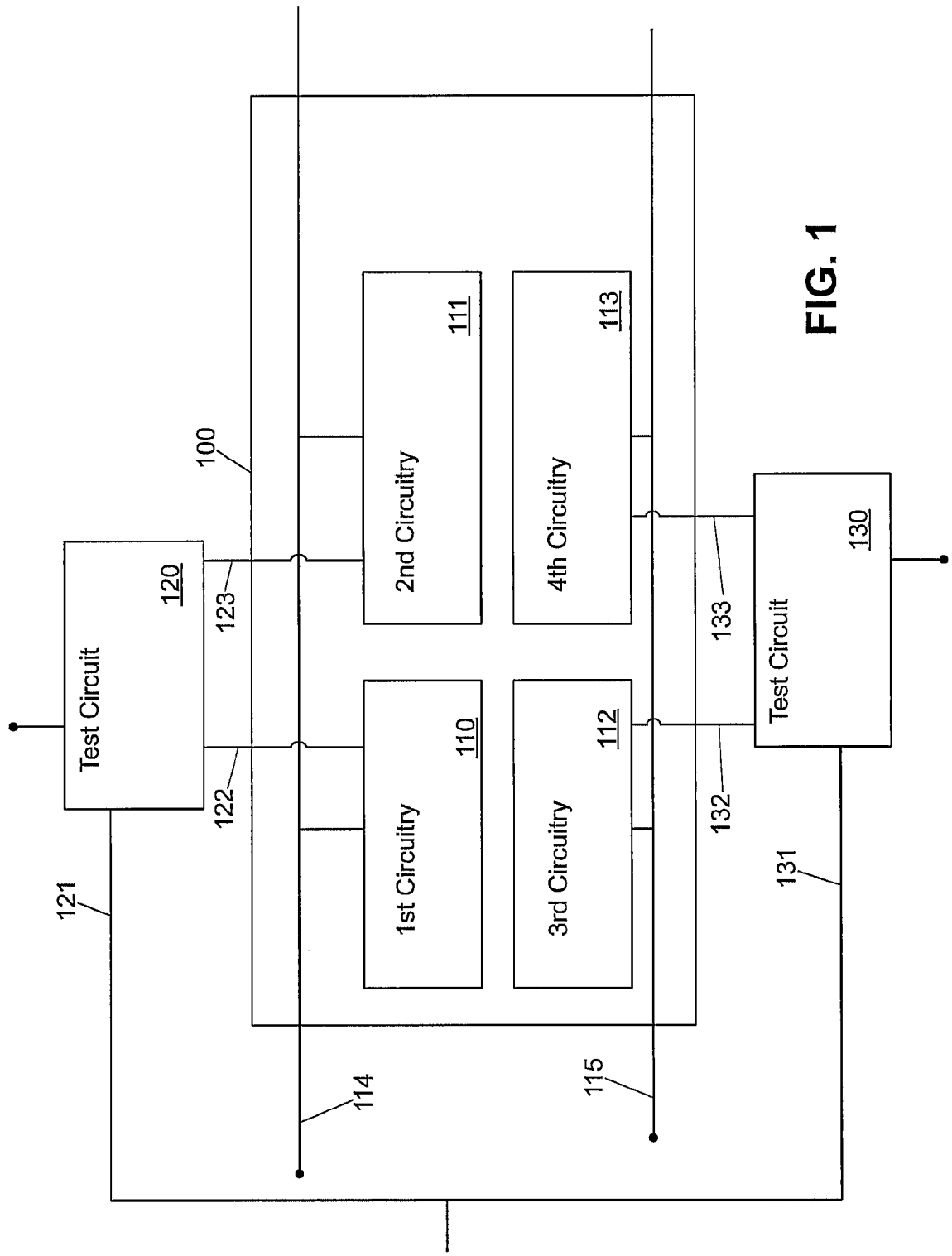
FIG. 1 illustrating a prior art die including testing circuitry.

FIG. 1 illustrates a prior art die 100. Die 100 includes four different portions or segments of circuitry 110-113. First portion of circuitry 110 and second portion of circuitry 111 receive clock signals at first frequency over path 114. Third portion of circuitry 112 and fourth portion of circuitry 113 receive clock signals at a second frequency over path 115. In this exemplary embodiment the first frequency is greater than second frequency. For purposes of this invention the exact configuration of first, second, third and fourth portions of circuitry 110-113 are not important and a description of the configurations is omitted for brevity.

Test circuitry 120 receives a global scan enable signal over path 121. Test circuitry 120 is connected to test first portion of circuitry 110 via path 122 and to second portion of circuitry 111 via path 123. Test circuitry 120 is used to test first portion of circuitry 110 and second portion of circuitry 111 for defects.

Test circuitry 130 receives a global scan enable signal over path 131. Test circuitry 130 is connected to third portion of circuitry 112 via path 132 and to fourth portion of circuitry 113 via path 133. Test circuitry 130 is used to test third portion of circuitry 112 and fourth portion of circuitry 113 for defects.

It is problem that if the global scan enable signal is switched at the first frequency of the first clock for at-speed testing, third portion of circuitry 112 and fourth portion of circuitry 113 are over tested. Over tested means that the switching frequency of scan enable signal is greater than the clock frequency causing more switches of the flip-flops in the testing circuitry than needed. If the global scan enable signal is switched at the second frequency of the second clock for at-speed testing, first portion of circuitry 110 and second portion of circuitry 111 are under tested. Under tested means that the global scan enable signal switches the flip-flops at a lower frequency then the clock of the circuit.

Figure 2:
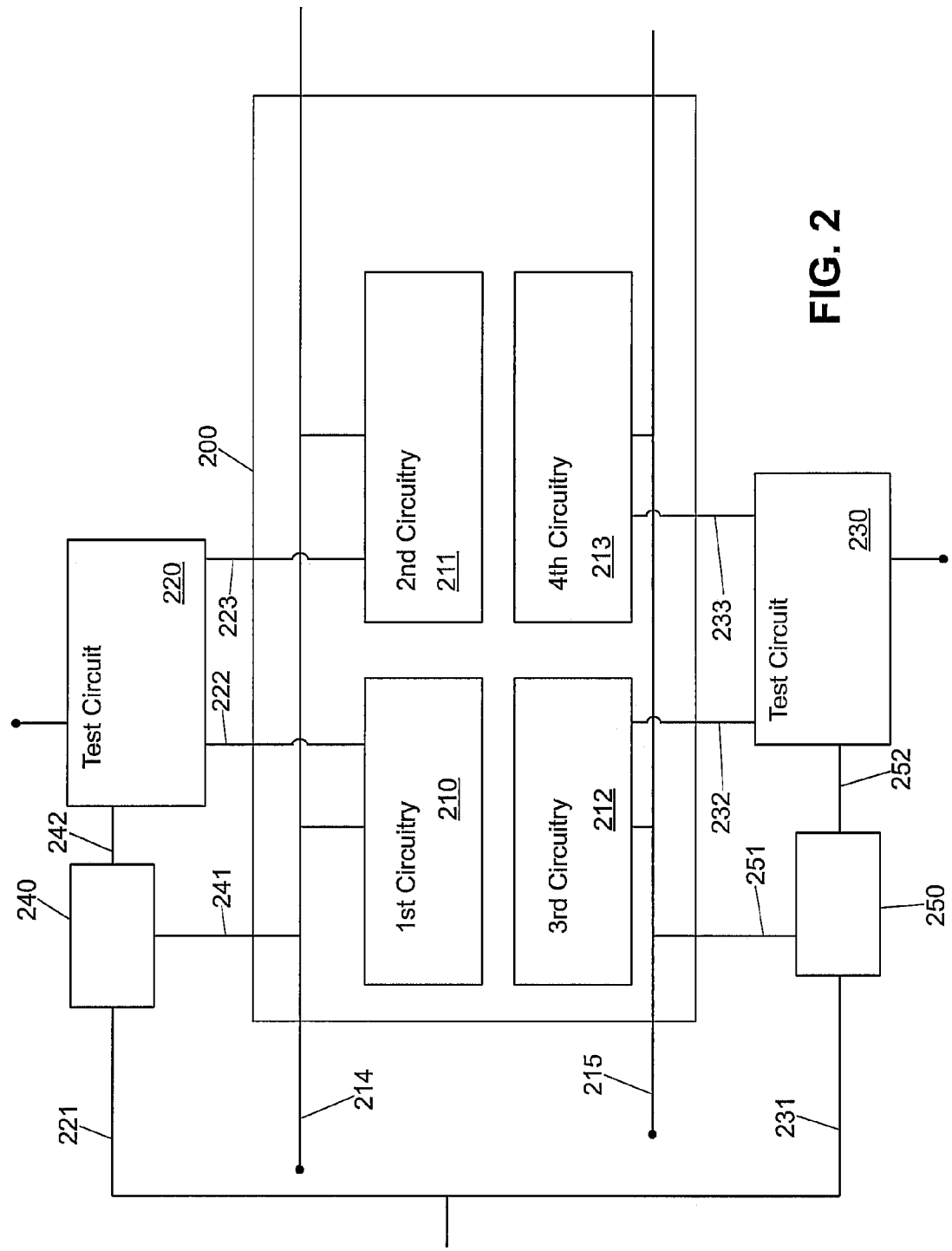
FIG. 2 illustrating a die including testing circuitry in accordance with this invention.

FIG. 2 illustrates a die 200 that includes circuitry in accordance with the present invention. Die 200 includes four different portions or segments of circuitry 210-213. First portion of circuitry 210 and second portion of circuitry 211 receive clock signals at first frequency over path 214. Third portion of circuitry 212 and fourth portion of circuitry 213 receive clock signals at a second frequency over path 215. In this exemplary embodiment the first frequency is greater than second frequency. For purposes of this invention the exact configuration of first, second, third and fourth portions of circuitry 210-213 are not important and a description of the configurations is omitted for brevity.

Local scan enable generating circuitry 240 receives a global scan enable signal via path 221 and clock signals at the first frequency via path 241. Local scan enable circuitry generates a local scan enable signal and applies the local scan enable signal to test circuitry 220 via path 242. Test circuitry 220 receives a local scan enable signal over path 242. Test circuitry 220 is connected to test first portion of circuitry 210 via path 222 and to second portion of circuitry 211 via path 223. Test circuitry 220 is used to test first portion of circuitry 210 and second portion of circuitry 211 for defects.

Local scan enable generating circuitry 250 receives a global scan enable signal via path 231 and clock signals at the second frequency via path 251. Local scan enable circuitry 250 generates a local scan enable signal and applies the local scan enable signal to test circuitry 230 via path 252. Test circuitry 230 receives a global scan enable signal over path 231. Test circuitry 230 is connected to third portion of circuitry 212 via path 232 and to fourth portion of circuitry 213 via path 233. Test circuitry 230 is used to test third portion of circuitry 212 and fourth portion of circuitry 213 for defects.

Figure 3:
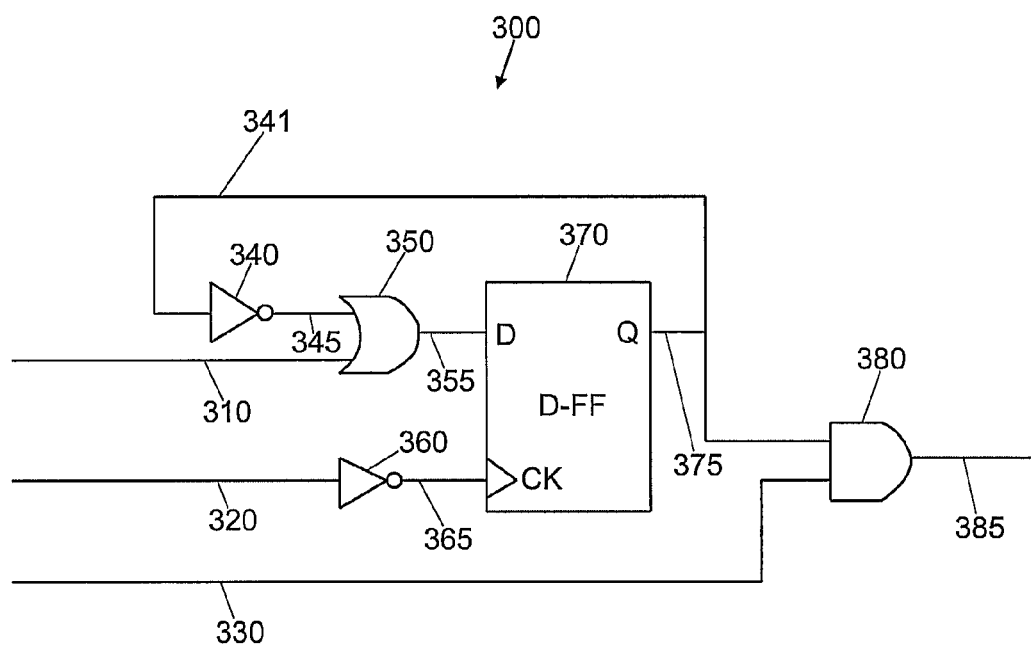
FIG. 3 illustrating circuitry for generating a local scan enable signal in accordance with this invention.

FIG. 3 illustrates local scan enable signal generating circuitry 300 in accordance with an exemplary embodiment of this invention. Circuitry 300 receives a global scan enable signal via path 310, a clock signal from the capture clock of the circuitry to be tested via path 320, and a test mode signal via path 330. These signals are generated by circuitry controlling the test process. The clock signal on path 320 is applied to an inverter 360. The inverter allows a half-cycle delay of the signal. Path 310 is input to or-gate to apply the global scan enable signal to the or-gate. The second input of the or-gate is connected to path 345 to receive an inversion of the output of flip-370. The output of or-gate 350 is applied to an input of flip-flop 370 via path 355. The output of inverter 360 is also applied to the clock input of flip-flop 370. The output of flip-flop 370 is applied to the input of inverter 340 via path 341 and to an input of and-gate 380 via path 375. Path 370 is also connected to an input of and-gate 370 to AND the Test Mode signal and the output of the flip-flop to generate the local scan enable signal which is output via path 385.

Figure 4:
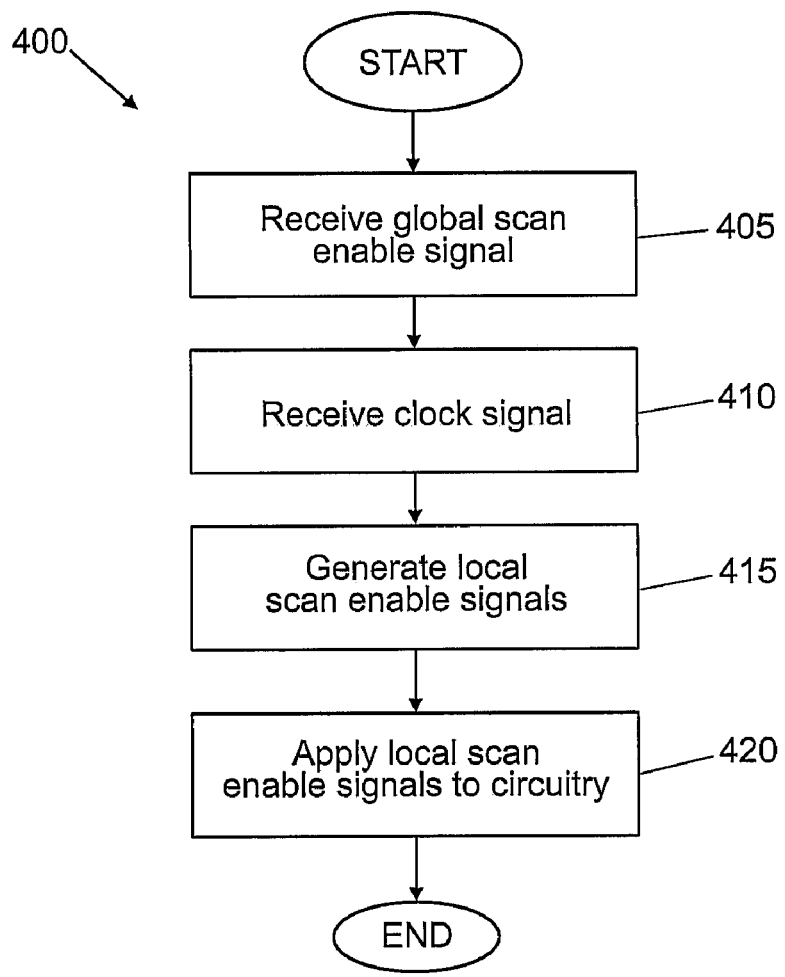
FIG. 4 illustrating a flow diagram for producing a local scan enable signal in accordance with this invention.

FIG. 4 illustrates a method 400 for generating a local scan enable signal and providing the local scan enable signal to test circuitry according to an exemplary embodiment of this invention. Process 400 begins in step 405 by receiving global scan enable signals. Clock signals are received in step 410. Local scan enable signals are generated from the clock signals and global scan enable signals in step 415. In step 420 the local scan enable signals are applied to the test circuitry and process 400 ends.

Figure 5:
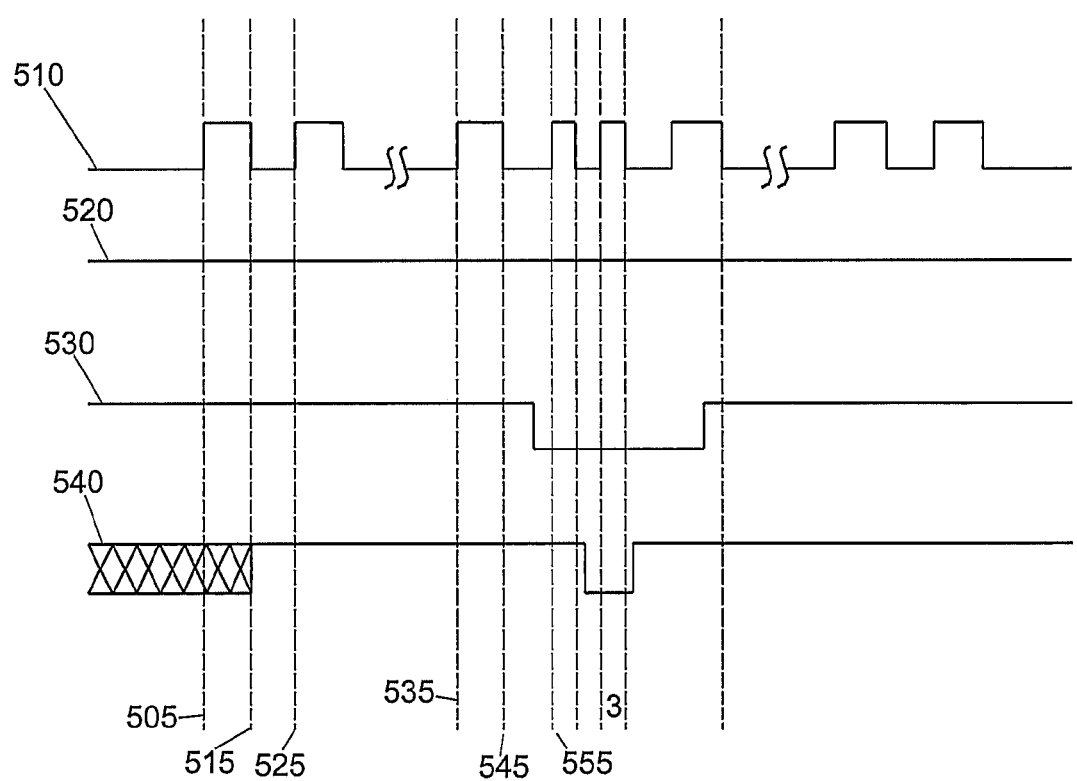
FIG. 5 illustrating a timing diagram of signals in accordance with this invention.

FIG. 5 illustrates a timing chart of the signals for performing an at-speed test using the local scan enable generating circuitry in accordance with this invention. Clock signals generated by the capture clock of the circuitry to be tested is shown along line 510. The test mode signal for the circuit is shown along line 520. The global scan enable signal is shown along line 530. The local scan enable signal generated by the circuitry is shown along line 540.

A test of the circuitry starts with an initialization phase. Since the local scan enable signal is an output of a flip-flop, the flip-flop must be initialized to a known value. This step is only performed at the beginning of the test and may be disregarded for subsequent cycles of the test. In order to initialize the flip-flop to a known value, the global scan enable cycle and the test mode signal are pulled high before time 1 indicated by line 505. The first cycle of the clock is then applied at time 1 shown at line 510. At the negative edge of the clock cycle shown at line 515, the local scan enable signal goes high from an unknown value. This puts the circuitry to be tested in scan shift mode.

After the initialization is complete, the proper value of the local scan enable value is available. Clock signals are then applied to the circuitry from time 3 indicated by line 525 and time 4 indicated by line 535. The test is then ready to enter a capture phase. The loading phase and capture phase overlap by a half of a clock cycle.

The capture phase begins by asserting the global scan enable signal low after the negative edge of the Nth−1 shift cycle shown at time 5 at line 545. In this embodiment, the load phase last N cycles. At time 6 shown at line 555, the Nth shift cycle occurs. Time 7, shown at line 555, is the completion of the Nth clock cycle. At time 8, shown at line 565, a capture cycle occurs. The time between the Nth shift edge and the capture edge must be equal to a clock period. The local scan enable must switch from high to low and back to high in this period.

After the Nth cycle, a low is captured in the flip-flop. This causes the local scan enable signal to be low before the capture cycle begins. At time 8, shown as line 575 scan flip-flops capture the response of circuit to the clock signals applied. At this time, the global scan enable signal and the local scan enable signal are low. During following negative edge of the clock cycle at time 9 shown as line 585, the flip-flop captures a high. Thus, the local scan enable signal is high after the capture cycle. The high local scan enable signal indicates an end to the capture cycle. After the capture cycle, the global scan enable signal is asserted high and remains high until the next capture cycle.

The above is a description of circuitry for generating a local scan enable signal and a method of performing an at-speed test using the local scan enable signal. It is expected that those skilled in the art can and will design alternative embodiments of this invention that infringe on this invention as set forth in the claims below either literally or through the Doctrine of Equivalents.

The invention claimed is:

1. An apparatus for providing a local scan enable signal to a circuitry on a portion of a die comprising: circuitry that receives a global scan enable signal; circuitry that receives a clock signal; circuitry that receives a test mode signal that indicates said portion of said die is to be tested; circuitry that generates said local scan enable signal responsive to reception of said global scan enable signal and said clock signal comprising: a flip-flop that receives said clock signal and said global enable signal and generates said local scan enable signal, an inverter that receives said clock signal and applies said clock signal to said flip-flop, or-gate circuitry that receives said global enable signal and an inverted output from said flip-flop and applies an output to said flip-flop, an inverter connected to an output of said flip-flop and to an input of said or-gate circuitry to provide said inverted output of said flip-flop, and and-gate circuitry having a first input connected to said output of said flip-flop to receive said intermediate local scan enable signal, a second input for receiving for receiving said global enable signal, and an output connected to an input of said flip-flop; and circuitry that applies said local scan enable signal to said portion.

2. An apparatus for testing circuitry in a portion of a die at operating speed comprising:

means for receiving a clock signal;

means for receiving a global scan enable signal;

means for generating a local scan enable signal from said clock signal and global scan enable signal responsive to receiving said clock signal and said global scan enable signal, said means for generating comprises:

flip-flop means that receives said clock signal and said global enable signal and generates said local scan enable signal, inverter means that receives said clock signal and applies said clock signal to said flip-flop means, or-gate means that receives said global enable signal and an inverted output from said flip-flop and applies an output to said flip-flop means, inverter means connected to an output of said flip-flop means and to an input of said or-gate means to provide said inverted output of said flip-flop means, and and-gate means having a first input connected to said output of said flip-flop to receive said intermediate local scan enable signal, a second input for receiving for receiving said global enable signal, and an output connected to an input of said flip-flop means; and means for applying said local scan enable signal to said portion.

\* \* \* \* \*